United States Patent [19]

Ollivier et al.

[11] 4,164,629
[45] Aug. 14, 1979

[54] TIME BASE FOR SYNCHRONOUS GENERATION OF FRAME AND CLOCK PULSES

[75] Inventors: Yves Ollivier, Perros Guirec; Michel Jacob, Lannion, both of France

[73] Assignee: Compagnie Industrielle Des Telecommunications Cit-Alcatel, Paris, France

[21] Appl. No.: 903,334

[22] Filed: May 5, 1978

[30] Foreign Application Priority Data

May 10, 1977 [FR] France ................ 77 14184

[51] Int. Cl.² ................ H04J 3/06
[52] U.S. Cl. ................ 179/15 BS; 307/219;
 331/2; 331/47; 331/55; 178/69.1
[58] Field of Search ............ 178/69.1; 179/15 BS;
 325/58; 331/2, 47, 55; 307/269, 357, 219;
 328/62

[56] References Cited

U.S. PATENT DOCUMENTS

| | | | |
|---|---|---|---|
| 3,522,455 | 8/1970 | Thomas et al. | 307/269 |
| 3,686,657 | 8/1972 | Renoulin | 340/248 A |
| 4,096,396 | 7/1978 | Belforte et al. | 307/219 |

FOREIGN PATENT DOCUMENTS 2315736 1/1977 France.

Primary Examiner—Robert L. Griffin
Assistant Examiner—Peter Durigon
Attorney, Agent, or Firm—Sughrue, Rothwell, Mion, Zinn and Macpeak

[57] ABSTRACT

The invention relates to high-security time bases. A time base comprises three synchronized generators which each deliver a clock signal 2h or a synchronizing signal Sy used for synchronizing frames. Each generator includes an oscillator driven by a phase comparator which receives the three clock signals and by an internal locking circuit which receives a signal connected to the external synchronizing signal and/or a signal connected to the synchronizing signal Sy inherent to the generator, the synchronizing signal Sy being synchronized by a majority circuit which receives the synchronizing signals Sy from the three generators. Application to data processing installations and in particular to telephone exchanges.

6 Claims, 6 Drawing Figures

TIME BASE FOR SYNCHRONOUS GENERATION OF FRAME AND CLOCK PULSES

The invention relates to high-security time bases used in data processing installations in which breakdowns cannot be tolerated and which for this reason include an association of several clock signal generators subjected to thorough checks. One of the main applications is that of automatic time division switching equipment for telephony.

In some data processing installations, and in particular in an automatic time division switching equipment, it is indispensable to distribute clock signals to a number of components with a very high degree of security.

For this purpose, it is known to use an interconnected assembly of three clock signal generators in combination with a checking device which includes three majority logic circuits with three inputs connected respectively to the three generators. A first comparator compares the output signal of the first majority logic circuit with that of the first generator, a second comparator compares the output signal of the second majority logic circuit with that of the second generator; a third comparator compares the output signal of the third majority logic circuit with that of the third generator. If one of the comparators (called upstream comparators) detects a discordance, it emits an alarm signal.

Each majority logic circuit applies its output signal firstly to a direct output amplifier and secondly via an inverter to an inverse output amplifier. The direct signal and the inverse signal connected to each majority logic circuit are applied to two inputs of a downstream checking device; there are therefore three downstream checks. The outputs of the direct output amplifiers are each connected via a resistor to a single direct output terminal; likewise, the outputs of the inverse output amplifiers are connected each via a resistor to a single inverse output terminal. The direct and indirect output terminals are connected to two inputs of a threshold receiver whose outputs are multipled on two terminals of each downstream checking device. The two direct and inverse output terminals are also connected to the various components to which the clock signals are to be applied. If the signals do not concord, the downstream checking device concerned emits an alarm signal.

French Pat. No. 2,080,251 (equivalent to British Pat. No. 1,307,808 and U.S. Pat. No. 3,686,657) also describes a simpler arrangement in which the upstream checking devices are not connected and in which the threshold receiver is replaced by an analog majority threshold receiver, i.e., an arrangement dimensioned as a function of the cumulated amplitude of at least two of the three signals.

Known devices have a number of drawbacks: if one of the signal generators breaks down, it is impossible to know which one has done so; the currents delivered by the direct and inverse output amplifiers must be carefully calibrated; lastly, adjustments must be made on direct and inverse output circuits in order to compensate for the transfer time between the connections which connect the direct and inverse output amplifiers to the direct and inverse output terminals.

Preferred embodiments of the present invention provide a time base which mitigates these drawbacks.

The present invention provides a time base for generating clock pulses and frame synchronizing pulses, the time base being constituted by three identical generators each of which includes a base oscillator for generating a basic signal proper to the generator, the basic signals of all three generators being applied to a phase comparator in each generator and the phase comparators being arranged to apply a frequency control signal to their respective oscillators to generate their basic signals in synchronism with each other, each of the generators further including a clock signal generating circuit comprising a majority circuit connected to receive all three basic signals and driving a filter circuit tuned to the clock pulse frequency, the output of the filter circuit being delivered via an amplifier to provide the clock pulses with a pulse waveform and the clock signal generating circuit including a differential amplifier responsive to the marks and the spaces of the clock pulse waveform to bias the output of the filter to achieve a desired mark/space ratio, each of the generators also including means for generating and synchronizing the frame synchronizing pulses, said means comprising an internal-frequency divider connected to receive the clock pulses and to produce the frame synchronizing pulses therefrom, a first frame synchronising majority circuit connected to receive frame synchronizing pulses from all three generators to derive a reset signal for the internal-frequency divider, and a feedback circuit enabling modifications to be made to the frequency control of the base oscillator in response to the synchronization of the frame synchronizing signals.

An embodiment of the invention is described by way of example with reference to the accompanying drawings in which.

Figure 1:
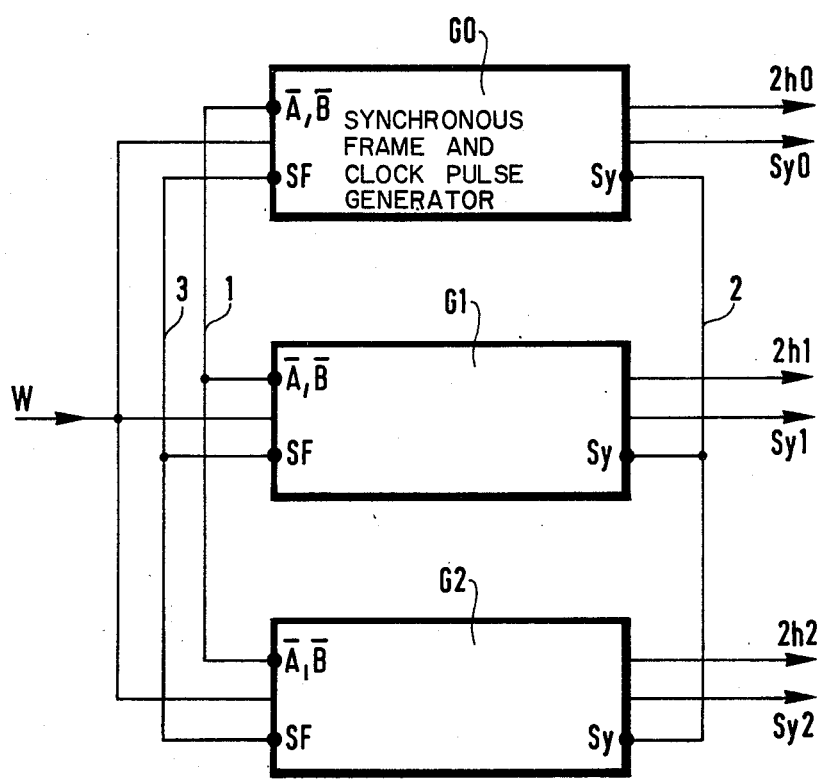
FIG. 1 shows a time base.

FIG. 1 shows a time base which comprises three identical generators G0, G1, G2 which each deliver respective clock signals 2h0, 2h1, 2h2, and respective frame synchronizing signals Sy0, Sy1, Sy2. The clock signals are at a frequency of 6.144 MHz and have a form factor of 0.5; a clock signal therefore has a value of 1 during 81.5 nanoseconds and a value of 0 during 81.5 nanoseconds. The frame synchronizing signals are at the frequency of 8 kHz and have a form factor of 1/768; a frame synchronizing signal is therefore constituted by pulses which last 163 nanoseconds every 125 microseconds. The frame synchronizing signals allow the various units driven by the time base to operate in frame synchronization, a frame lasting 125 microseconds. Each generator is connected to the other two by four wires of a connection 1 which convey basic signals $\overline{A}$, $\overline{B}$; each generator is also connected to the other two by four wires of a connection 2 which convey the frame synchronizing signals Sy0, Sy1, Sy2. The generators can be synchronized by an external reference signal W whose frequency is 2.048 MHz; each generator is then connected to the other two by four wires of a connection 3 which convey signals in externally based frame-rate synchronization SF.

Figure 2:
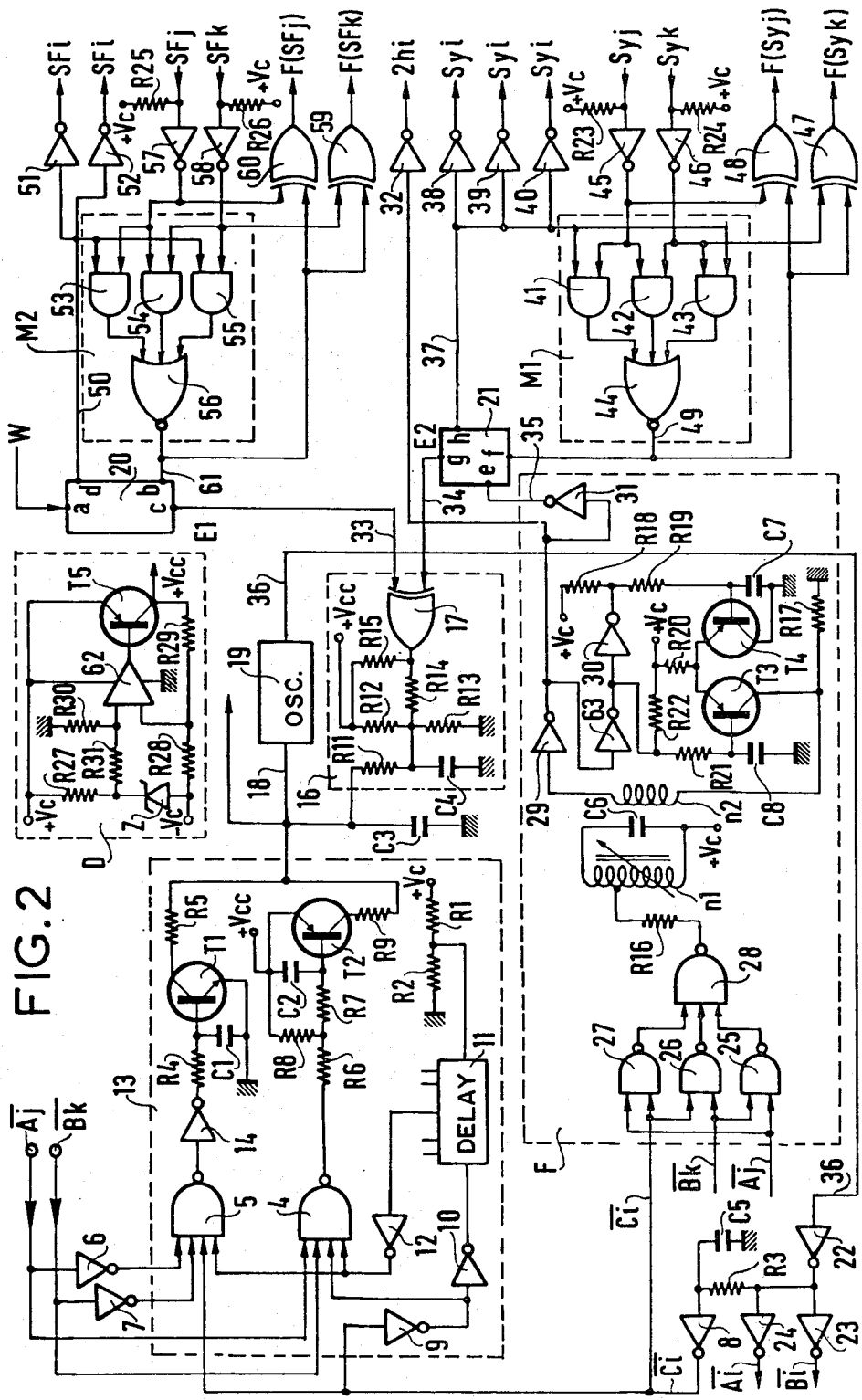
FIG. 2 shows a time base generator.

FIG. 2 shows one generator Gi, the index i relating to the generator shown, the indices j and k used in this figure relating to the other two generators of the time base. The indices i, j, k therefore relate, in the following order, to the generators G0, G1, G2 or G1, G2, G0 or G2, G0, G1, according to whether the index i relates to the generator G0, G1 or G2. As will be shown, each generator delivers three identical signals at 6.144 MHz, namely the basic signals $\overline{Ai}$, $\overline{Bi}$, $\overline{Ci}$; the basic signals $\overline{Ai}$ and $\overline{Bi}$ are distributed to the generators Gk and Gj, the basic signal $\overline{Ci}$ being used in the generator Gi itself.

The purpose of each generator Gi is to generate clock signals 2hi at 6.144 MHz and frame synchronizing signals Syi at intervals of 125 μs for use by other equipment, e.g., a time division telephone exchange. In this respect the only "useful" outputs of the generator are the outputs of inverters 32 and 38 shown near the middle of the right hand edge of FIG. 2. All the other outputs are for use by the other two generators or serve as alarms when synchronization is lost.

Two levels of synchronization are needed: at the clock pulse frequency of 6.144 MHz and at the frame frequency of 8 KHz. The signals actually generated by each of the crystal oscillators are referred to as basic signals. They are at the clock pulse frequency and serve for the generation of the required clock signals 2hi after suitable filtering. For frame-rate synchronization there are two sets of circuits: a first set establishes a common phase for frame synchronizing signals between the three generators, while a second set receives the external reference signal W. The external signal W is very highly accurate in frequency and is used to impose its accuracy on the crystal oscillators of the generators in the event that it is available.

A phase comparator 13 includes at its input two NAND gates 4 and 5; a basic signal $\overline{Aj}$ is applied directly to a first input of the NAND gate 4 and via an inverter 6 to a first input of the NAND gate 5; a basic signal $\overline{Bk}$ is applied directly to a second input of the NAND gate 4 and via an inverter 7 to a second input of the NAND gate 5. A basic signal $\overline{Ci}$ delivered by an inverter 8 is applied firstly to a third input of the NAND gate 5 and secondly to an inverter 9 of the phase comparator; the output of the inverter 9 is connected firstly to a third input of the NAND gate 4 and secondly to an inverter 10 whose output is connected to the input of a delay device 11, which is a delay line which lumped constants monitored by a divider bridge constituted by two resistors R1 and R2 connected between a DC voltage +Vc of 5 volts for example and earth. The output of the delay device 11 is connected via an inverter 12 to a fourth input of the NAND gates 4 and 5. The output of the NAND gate 4 is connected to two resistors R6 and R7 in series at the base of a PNP type transistor T2; a stabilized DC voltage +Vcc of 4 volts for example, is applied to the emitter of the transistor T2; a capacitor C2 is connected between the emiter and the base of the transistor T2; a resistor R8 is connected between the emitter of the transistor T2 and a common point of the resistors R6 and R7; the collector of the transistor T2 is connected to a resistor R9. The output of the NAND gate 5 is connected to the base of an NPN type transistor T1 by an inverter 14 and a resistor R4 in series; a capacitor C1, is connected between the emitter and the base of the transistor T1, said emitter being connected to earth; a resistor R5 is connected to the collector of the transistor T1. The resistors R5 and R9 are interconnected and their common point is connected via a connection 18, which constitutes the output of the phase comparator, to a control input of an oscillator 19 of the quartz oscillator type; the connection 18 is connected to earth via a capacitor C3.

An external locking circuit 16 includes an exclusive OR circuit 17 one of whose inputs is connected by a wire 33 to an output terminal c of a divider 20 for dividing the external frequency and receives from it a signal E1; another input of the exclusive OR gate 17 is connected by a wire 34 to an output terminal g of divider 21 for dividing an internal frequency and receives a signal E2 from it. The external-frequency divider 20 divides by 256 and receives the external reference signal W whose frequency is 2.048 MHz on an input terminal a; the internal-frequency divider 21 divides by 768 and receives a 6.144 MHz signal on an input terminal e. The output of the exclusive OR gate 17 is connected to the stabilised DC voltage +Vcc by a resistor R15, a divider bridge constituted by two resistors R12 and R13 in series is connected between the stabilized DC voltage +Vcc and earth; the point common to the resistors R12 and R13 is connected firstly to the output of the exclusive OR gate 17 by a resistor R14 and secondly to the connection 18 by a resistor R11; a capacitor C4 is connected between earth and the point common to the resistors R11, R12, R13 and R14. The output of the oscillator 19 is connected by a wire 36 to an inverter 22 whose output is connected firstly to two inverters 23 and 24 and secondly via a resistor R3 to the inverter 8 and to a capacitor C5 connected to earth. The inverter 23 delivers at its output a signal $\overline{Bi}$, sent towards the generator Gk and the inverter 24 delivers at the output a signal $\overline{Ai}$, sent towards the generator Gj.

A signal generating circuit F generates the clock signal $2.\overline{hi}$ from the basic signals $\overline{Aj}$, $\overline{Bk}$, $\overline{Ci}$; the signal generating circuit includes a logic majority circuit constituted by three NAND gates 25, 26 and 27. The NAND gate 25 receives the basic signal $\overline{Aj}$ on one input and the basic signal $\overline{Ci}$ on another input; the NAND gate 27 receives the basic signal $\overline{Ci}$ on one input and the basic signal $\overline{Aj}$ on another input. The outputs of the NAND gates 25, 26, 27 are connected to respective inputs of a NAND gate 28 whose output is connected via a resistor R16 to the mid point of a primary winding n1 of a transformer; the ends of said primary winding are connected to a capacitor C6 one of whose terminals is connected to the positive DC voltage +Vc, which is 5 volts for example; a secondary winding n2 of said transformer has one end connected to earth via a resistor R17 and another end connected to an inverter 28 whose output is connected to two inverters 63, 31. The output of the inverter 63 is connected to an inverter 30 whose output is connected firstly to the DC voltage +Vc via a resistor R18 and secondly to earth via a resistor R19 and a capacitor C7 in series. Two PNP type transistors T3 and T4 have their emitters connected to the DC voltage +Vc via a resistor R20; the base of the transistor T3 is connected via a resistor R21 firstly to the output of the inverter 63 and secondly to the DC voltage +Vc via a resistor R22; the collector of the transistor T4 is connected to earth and its base is also connected to earth via a capacitor C7. The transistor T3 has its base connected to earth via a capacitor C8 and its collector connected to a point common to the secondary winding n2 and to the resistor R17; the inverter 31 has its output connected to the input terminal e of the internal-frequency divider 21 via the wire 35. The output of the inverter 29 is also connected to an inverter 32 outside the signal generating circuit F; said inverter 32 delivers the clock signal $2.\overline{hi}$. An output terminal of the internal-frequency divider 21 is connected by a wire 37 firstly to three inverters 38, 39 and 40 and secondly to an input of two AND gates 41, 43; each inverter 38, 39 and 40 delivers a frame synchronizing signal SYi at its output. The first frame synchronizing signal majority circuit M1 is constituted by three AND gates 41, 42 and 43 and a NOR gate 44. A synchronizing signal Syj is applied to an inverter 45 whose input is connected to the DC voltage +Vc by a resistor R23; the output of the inverter 45 is connected to an input of the AND gate 41, to an input of an AND gate 42 as well as to an input of an exclusive OR gate 48; a synchronizing signal Syk is applied to an inverter 46 whose input is connected to the DC voltage +Vc by a resistor R24; the output of the inverter 46 is connected to an input of the AND gates 42 and 43, as well as to an input of an exclusive OR gate 47. The output of each of the AND gates 41, 42 and 43 is connected to a respective input of the NOR gate 44 whose output is connected by a connection 49 firstly to an input terminal f of the internal-frequency divider 21 and secondly to an input of the exclusive OR gates 47 and 48. The exclusive OR gates 47 and 48 deliver respective error signals F (Syk) and F (Syj) in the case of an error on the respective synchronizing signals Syk and Syj.

A second frame synchronizing signal majority circuit M2 is constituted by three AND gates 53, 54 and 55 and a NOR gate 56. An output d of the external-frequency divider 20 is connected by a wire 50 firstly to two inverters 51 and 52 and secondly to an input of the AND gates 53 and 55; each inverter delivers an externally-based frame-rate synchronizing signal SFi at its output.

An externally-based synchronizing signal SFj which comes from the generator Gj is applied to an inverter 57 whose input is connected to the DC voltage +Vc by a resistor R25; the output of the inverter 57 is connected to an input of the AND gate 53, to an input of an AND gate 54 and to an input of an exclusive OR gate 60; a synchronizing signal SFk which comes from the generator Gk is applied to an inverter 58 whose input is connected to the DC voltage +Vc by a resistor R26; the output of the inverter 58 is connected to an input of the AND gates 54 and 55 as well as to an input of an exclusive OR gate 59. The output of each of the AND gates 53, 54 and 55 is connected to a respective input of the NOR gate 56 whose output is connected by a connection 61 firstly to an input b of the external-frequency divider 20 and secondly to an input of the exclusive OR gates 59 and 60. The exclusive OR gates 59 and 60 deliver respectively a signal F (SFk) and F (SFj) in the case of an error on the externally-based frame-rate synchronizing signals SFk and SFj respectively.

FIG. 2 also shows by way of an example a supply circuit D which delivers the stabilized DC voltage +Vcc. This conventionally designed circuit includes: a zener diode Z and a resistor R27 in series between the DC voltage +Vc and a DC voltage −Vc; a differential amplifier 62 supplied by the DC voltages +Vc and −Vc has an input connected firstly to the DC voltage −Vc by a resistor R28 and secondly to the collector of a transistor T5 by a resistor R29; another input of the differential amplifier 62 is connected firstly to earth by a resistor R30 and secondly to the point common to the resistor R27 and to the zener diode Z by a resistor R31; the output of the differential amplifier 62 is connected to the base of the transistor T5 whose emitter is connected to the DC voltage +Vc; the collector of the transistor T5 delivers the stabilized DC voltage +Vcc.

The generator shown in FIG. 2 operates as follows: the oscillator 19 delivers a signal at 6.144 MHz via the wire 36 and the inverter 22 to the inverters 8, 24 and 23 whose output signals are referenced $\overline{Ci}$, $\overline{Ai}$ and $\overline{Bi}$ respectively. The basic signals are for application to the generators Gk and Gj respectively; The basic signal $\overline{Ci}$ is applied to the delay device 11 which delivers a delayed basic signal $\overline{Cir}$ whose delay in relation to the basic signal $\overline{Ci}$ is $\pi/2$. The phase comparator 13 delivers either a lead control signal or a lag control signal, or no signal to the oscillator 19 via the connection 18 according to the position of the basic signal $\overline{Ci}$ in relation to the basic signals $\overline{Aj}$ and $\overline{Bk}$, in order to maintain the frequency/phase-difference characteristic of the signal delivered by the oscillator within required limits. The transistor T1 delivers to the oscillator a lag control signal CRT given by the logic equation:

$$CRT = Aj + Bk + \overline{Ci} + Cir$$

while the transistor T2 delivers a lead control signal CAV given by the logic equation:

$$CAV = \overline{Aj} + \overline{Bk} + Ci + Cir$$

The lag control signal CRT discharges the capacitor C3, while the lead control signal charges the capacitor C3.

The lead control signal CAV is emitted by the phase comparator when the basic signal $\overline{Ci}$ is delayed with respect to the basic signals $\overline{Aj}$ and $\overline{Bk}$; a lag control signal is emitted when the basic signal $\overline{Ci}$ is in advance with respect to the basic signals $\overline{Aj}$ and $\overline{Bk}$. The phase comparator 13 therefore internally locks the oscillator 19.

The external locking circuit 16 delivers a voltage to the oscillator by the connection 8 which detects the voltage/phase difference curve of the phase comparator 13, a shift takes place along the voltage axis. Since the oscillator 19 has a frequency/voltage curve with positive slope, stable external locking corresponds to the positive slope zone of the voltage/phase difference curve of the external locking circuit which circuit compares the phases of the signals coming from the external-frequency divider 20 and from the internal-frequency divider 21. If the frequencies delivered by these frequency dividers are equal, the rest point will be such that the phase difference $\phi_1 - \phi_2$ between the signals E1 and E2 applied to the inputs of the exclusive OR gate 17 of the external locking circuit 16 is equal to $\pi/2 + 2k\pi$ where "k" is a non-negative integer. The signal E2 which corresponds to the signal which comes from the oscillator 19 after division by 768 is shifted backwards by $\pi/2$ in relation to the signal E1 which corresponds to the external synchronization signal W after division by 256. The phase difference between the signals E1 and E2 can be between 0 and $\pi$.

Internal locking obtained by the phase comparator 13 must have priority with respect to external locking. This is possible in the following conditions:
  internal locking is more rapid than the external locking: i.e., $R9 \cdot C3 \leq R \cdot C4$, where R is the equivalent resistance of the circuit constituted by the resistors R12, R14 and R15;
  the gain of the internal locking loop is greater than that of the external locking loop; to obtain this, the frequency of the external synchronization signal W is divided by 256 (external-frequency divider 20); and the capture frequency band of the internal locking circuit is higher than that of the external locking circuit; this is effected by the resistance bridge R12, R13 and R14 which limits the external locking to a value lower than $10^{-5}$ for example.

The clock signal 2hi and the frame synchronizing signal Syi delivered by the generator in FIG. 2 are generated by the circuit constituted by the NAND gates 25, 26, 27 and 28; this circuit performs a logic majority function defined by $M = \overline{Aj \cdot Ci} + \overline{Aj \cdot Bk} + \overline{Bk \cdot Ci}$. This function is not valid unless at least two basic signals of the three are identical in phase and in duty ratio. A filter constituted by the primary winding n1 and the capacitor C6 is tuned to the frequency of the basic signals, i.e., 6.144 Mhz so as to stop any interference signals. The sinusoidal signal obtained after filtering at the terminals of the secondary winding n2 is converted into a square signal by the inverter 29 whose input is biassed by the resistor R17; an inverted signal $\overline{2hi}$ is obtained at the output of the inverter 29; the clock signal 2.hi is obtained at the output of the inverter 63 and the inverted clock signal $\overline{2hi}$ is obtained at the output of the inverter 30. The transistors T3 and T4 constitute a differential amplifier, the transistor T3 being driven by the average value of the inverted clock signal $\overline{2hi}$. The biassing of the inverter 29 therefore varies and tends to cancel the difference in voltage between the input signals of the transistors T3 and T4; the duty ratio of the clock signal $\overline{2hi}$ is regulated to the value 0.5.

Figure 3:
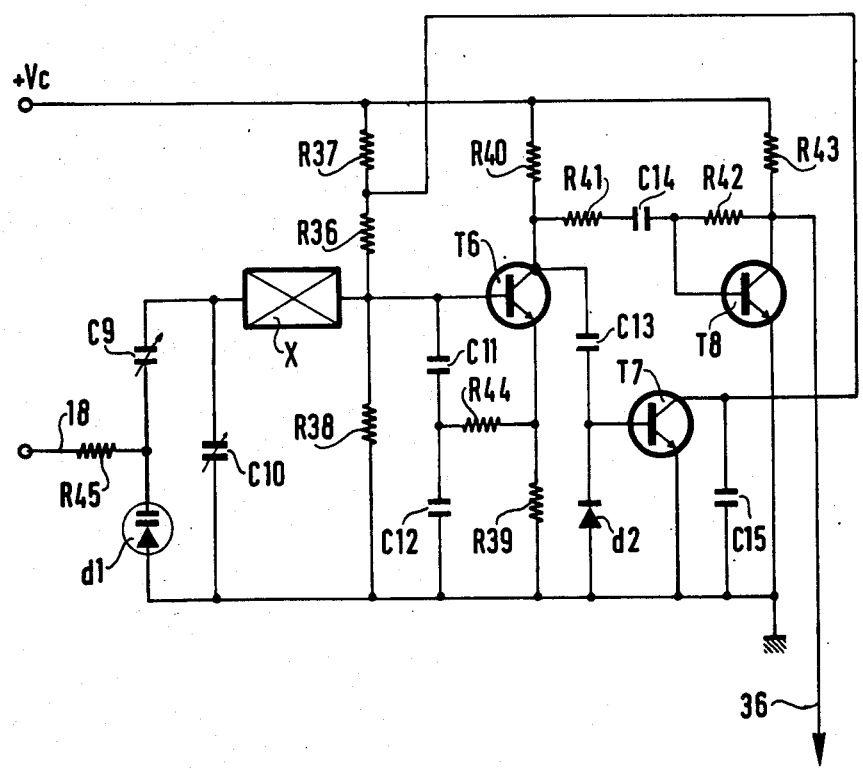
FIG. 3 shows an oscillator.

FIG. 3 shows the oscillator 19 of FIG. 2 which is a conventional type VCXO oscillator; a variable capacitance diode d1 in series with a capacitor C9 is connected between the earth and an electrode of a crystal X (such as a quartz crystal for example) said electrode also being connected to earth by a variable capacitor C10; the point common to the variable capacitance diode d1 and to the capacitor C9 is connected to the connection 18 by a resistor R45; another electrode of the crystal X is connected to the base of an NPN type transistor, said base also being connected firstly to the direct current voltage +Vc by two resistors R36 and R37 in series and secondly to earth by a resistor R38. The base of the transistor T6 is also connected to earth by two capacitors C11 and C12 in series, the point common to the two capacitors being connected to the emitter of the transistor T6 by a resistor R44, said emitter being connected to earth by a resistor R39. The collector of the transistor T6 is connected firstly to the base of an NPN type transistor T7 by a capacitor C13 and secondly to the DC voltage +Vc by a resistor R40; the collector of the transistor T6 is also connected to the base of an NPN type transistor T8 by a resistor R41 and a capacitor C14 in series. A diode d2 connects the earth to the base of the transistor T7 whose emitter is connected to the earth. The collector of the transistor T7 is connected firstly to the earth by a capacitor C15 and secondly to the point common to the resistors R36 and R37. The collector and the base of the transistor T8 are interconnected by a resistor R42; the collector of the transistor T8 is connected to the DC voltage +Vc by a resistor R43; the collector of the transistor T8 is also connected to the wire 36 which conveys the output signal of the oscillator, which signal has a frequency of 6.144 MHz.

The circuit constituted by the transistor T6, the capacitors C11 and C12 and the resistors R39 and R44 has a complex impedance whose real part Rc is negative; in the neighborhood of resonance, the assembly will oscillate if $Rq = Ro$, since the quartz is equivalent to a circuit Rq, Lq, Cq. A quartz in resonance has electrical properties equivalent to an Rq, Lq, Cq circuit, which is well known to one skilled in the art, the circuit being constituted by Lq inductance in series with Rq resistance and with a Cq capacity in parallel with the inductance, resistance unit Lq Rq.

The circuit constituted by the capacitors C9 and C10 and the variable capacitance diode d1 enables:
the frequency to be varied by modification of the control voltage on the connection 18; and
the frequency to be adjusted to its rated value by action on the capacitors C9 and C10, the control voltage on the connection 18 being at its rated value; this circuit constitutes the load capacitance of the quartz and its value must be 30 picofarads in the rated operating conditions for the quartz used. The circuit constituted by the capacitors C13 and C15, the diode d2 and the transistor T7 enables the output level of the sinusoidal signal on the collector of the transistor T6 to be regulated. The transistor T8 and the circuit which is associated with it converts the sinusoidal signal applied to the base as a square signal; the resistor R42 enables the duty ratio of said square signal to be adjusted.

Figure 4:
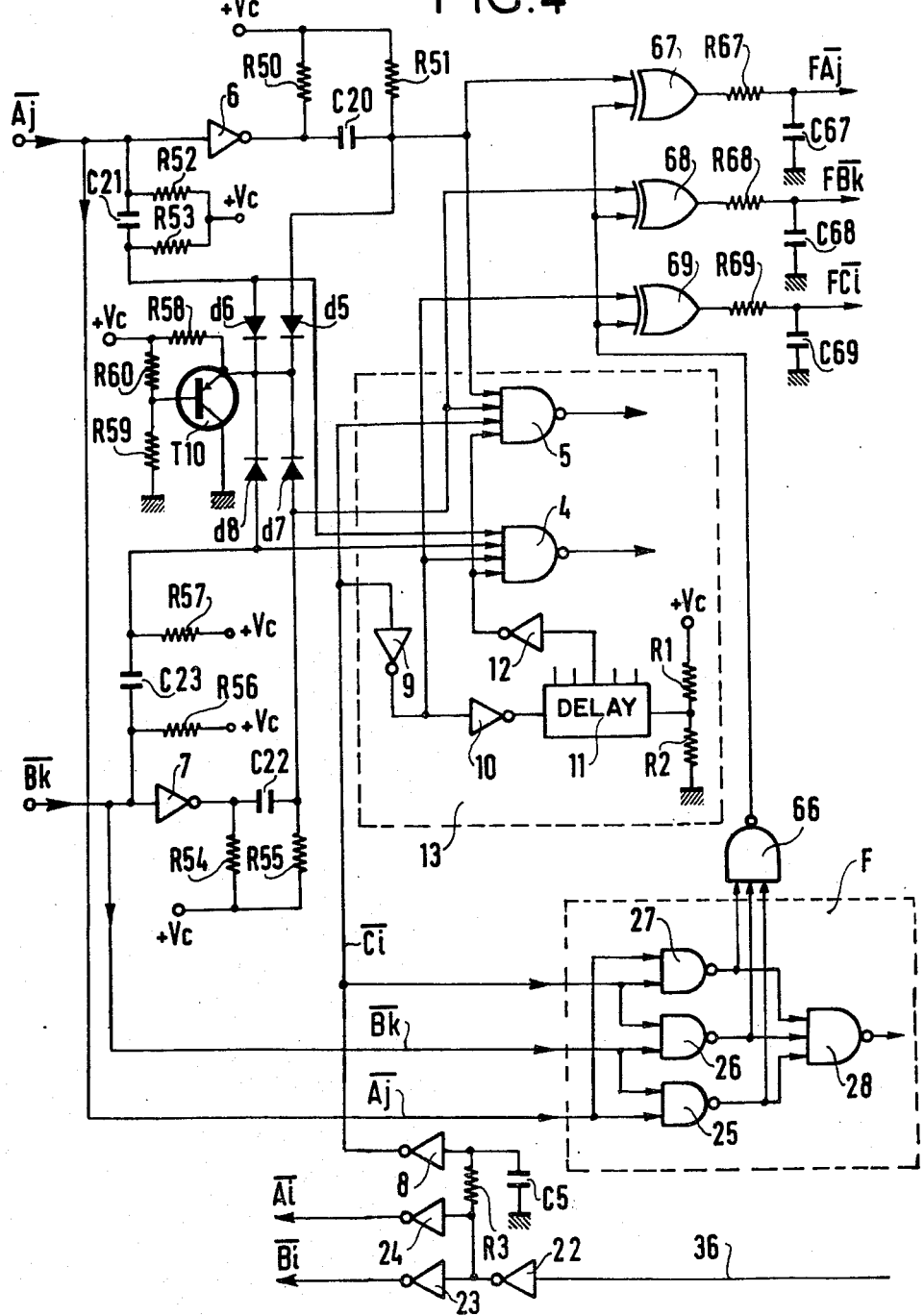
FIG. 4 shows a protective device on the inputs of the generator and an error detection device on the signals of the generators.

FIG. 4 shows a protective device on the inputs of the basic signals $\overline{Aj}$ and $\overline{Bk}$ of FIG. 2; FIG. 4 also shows an error detection device on the basic signals $\overline{Aj}$, $\overline{Bk}$ and $\overline{Ci}$. FIG. 4 shows some of the components of FIG. 2 again, i.e., the NAND gates 4, 5, 25, 26, 27 and 28, the inverters 6, 7, 8, 9, 10, 12, 22, 23 and 24, the delay device 11, the resistors R1, R2 and R3 and the capacitor C5.

The basic signal $\overline{Aj}$ is delivered to the inverter 6 as in the case of FIG. 2, but in FIG. 4, the output of the inverter 6 is connected firstly to an input of the NAND gate 5 via a capacitor C20 and secondly to the DC voltage +Vc by a resistor R50; the point common to the capacitor C20 and to the input of the NAND gate 5 is connected firstly to the direct current voltage +Vc by a resistor R51 and secondly to the emitter of an NPN type transistor T10 by a diode d5. The basic signal $\overline{Aj}$ is also delivered firstly to an input of the NAND gate 4 via a capacitor C21 and secondly to a resistor R52 connected to the DC voltage +Vc; the point common to the capacitor C21 and to the input of the NAND gate 4 is connected firstly to the DC voltage +Vc by a resistor R53 and secondly to the emitter of the transistor T10 by a diode d6. The basic signal $\overline{Bk}$ is delivered to the inverter 7 as in the case of FIG. 2, but in FIG. 4, the output of the inverter 7 is connected firstly to an input of the NAND gate 5 via a capacitor C22 and secondly to the DC voltage +Vc by a resistor R54; the point common to the capacitor C22 and to the input of the NAND gate 5 is connected firstly to the DC voltage +Vc by a resistor R55 and secondly to the emitter of the transistor T10 by a diode d7. The basic signal $\overline{Bk}$ is also delivered to an input of the NAND gate 4 via a capacitor C23 and secondly to a resistor R56 connected to the DC voltage +Vc; the point common to the capacitor C23 and to the input of the NAND gate 4 is connected firstly to the DC voltage +VC by a resistor R57 and secondly to the emitter of the transistor T10 by a diode d8. The transistor T10 has its collector connected to earth, its emitter connected to the direct current voltage +Vc by a resistor R58 and its base connected to the DC voltage +Vc by a resistor R60 and also to earth by a resistor R59.

The basic signals $\overline{Aj}$ and $\overline{Bk}$ come from the other two generators; when a generator Gj or Gk or both is either out of service or faulty, it must be considered by the other two generators, at established rate, as having a zero tendency, i.e., the corresponding basic sinal $\overline{Aj}$ or $\overline{Bk}$ whose value is permanently 0 or 1 must not be taken into consideration; for this purpose, the signal on the corresponding input of the NAND gates 4 and 5 must have the value 1 so as not to block said NAND gates. The aim of the circuit described and shown in FIG. 4 is therefore to allow the alternating component of the corresponding basic signal $\overline{Aj}$ or $\overline{Bk}$ to pass when the generator from which it comes is operating normally and to establish a level 1 with a correct response time at the inputs of the phase comparator 13 when a basic signal is in a permanent state. The capacitor C20 or C22 transmits the AC component and isolates the input from the NAND gate 5 or 4 when the basic signal $\overline{Aj}$ or $\overline{Bk}$ is in a permanent state. The resistor R51 or R55 biasses the input of the NAND gate 5 or 4 for a permanent state on the basic signal $\overline{Aj}$ or $\overline{Bk}$; the circuit formed by the resistor R50 and the diode d5 or the resistor R54 and the diode d7 aims to prevent an automatic biasing of the input of the NAND gate 5 or 4, due to the fact that the currents of the gate in the state 1 and in the state 0 are different; the biasing voltage of the diode d5 or d7 which is the voltage between the emitter of the transistor T10 and the earth then becomes necessary to guarantee level 1 on the input of the gate, i.e., the sum bias voltage + the voltage drop in the diode d5 (or d7) must be equal to or greater than 2.4 volts. FIG. 4 also shows an error detection device on the basic signals Aj, Bk and Ci; this device includes a NAND gate 66 with three inputs connected to the output of the NAND gates 25, 26 and 27 respectively, the output of the NAND gate 66 being connected to an input of each of three exclusive OR gates 67, 68 and 69; the exclusive OR gate 67 has another input connected to the point common to the capacitor C20 and to the resistor R51; the exclusive OR gate 68 has another input connected to the point common to the capacitor C22 and to the resistor R55; the exclusive OR gate 69 has another input connected to the output of the inverter 9. The exclusive OR gate 67 delivers an error signal of the basic signal FAj via a resistor R67 connected to earth by a capacitor C67; the exclusive OR gate 68 delivers an error signal of the basic signal FBk via a resistor R68 connected to earth by a capacitor C68; the exclusive OR gate 69 delivers a basic fault signal FCi via a resistor R68 connected to the earth by a capacitor C69. The NAND gate delivers a majority signal generated from the basic signals Aj, Bk and Ci received by the NAND gates 25, 26 and 27; each of the exclusive OR gates 67, 68 and 69 receives the corresponding basic signal and the majority signal and operates as a comparator; if the signals received are out of phase, the exclusive OR gate concerned delivers a basic signal error signal; the circuit composed by a resistor and a capacitor at the output of each of the exclusive OR gates constitutes a filter which filters outgoing pulses due to phase shifts of less than about 30 nanoseconds and which do not correspond to errors.

Figure 5:
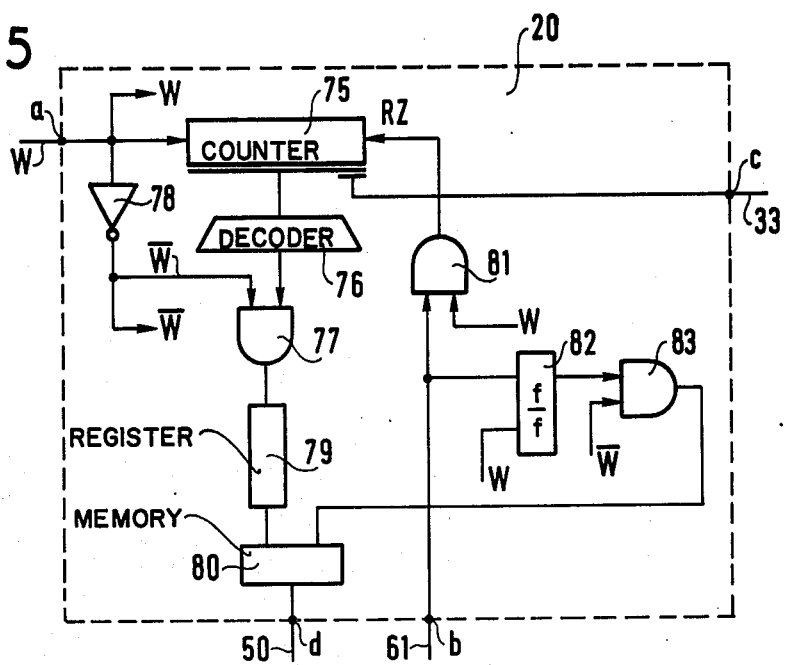
FIG. 5 shows a divider for an external frequency.

FIG. 5 shows the block diagram of the external-frequency divider of FIG. 2. The external reference signal W whose frequency is 2.048 MHz is applied to a series parallel type binary counter 75 which counts up to 256; the most significant bit is connected to the output terminal c which is itself connected to the wire 33; the parallel output of the binary counter is applied to a decoder 76 which divides by 256 provides an output pulse on count 255 to an input of an AND gate 77; the input terminal a which receives the external reference signal W is connected via an inverter 78 to another input of the AND gate 77; the output of the AND gate 77 is connected to a register 79 whose output is connected to an input of a memory location 80 which has its output connected to the output terminal d which is itself connected to the wire 50; the input terminal b, connected to the wire 61 is also connected firstly to an AND gate 81 and secondly to an input of a bistable 82 which has another input connected to the output terminal a; another input of the AND gate 81 is connected to the input terminal a; the output of the AND gate 81 is connected to an input RZ for resetting the binary counter 75 to zero; the output of the bistable 82 is connected to an input of an AND gate 83 another of whose inputs is connected to the output of the inverter 78; the output of the AND gate 83 is connected to another input of the memory location 80. The memory location 80 rises at the end of counting and delivers the externally-based frame-rates synchronizing signal SFi via the wire 50. When at least two such synchronizing signals are active on the inputs of the NAND gates 53, 54 and 55 of the second frame synchronizing majority circuit M2 (FIG. 2) the NOR gate 56 delivers a majority signal on the wire 61; this signal synchronizes firstly the binary counter 75 by resetting it to zero and secondly the memory location 80. When only one generator is in service, the memory location 80 rises; since no signal is received on the wire 61, there is no synchronization order. When a second generator is put in service, as soon as its memory location 80 rises, a signal is received from each generator which is synchronized, via wires 61; said signal is received each time counting is ended and the generators remain synchronized. When the third generator is put in service, it cannot influence the synchronism of the two generators which are already in service and which synchronize said third generator.

Figure 6:
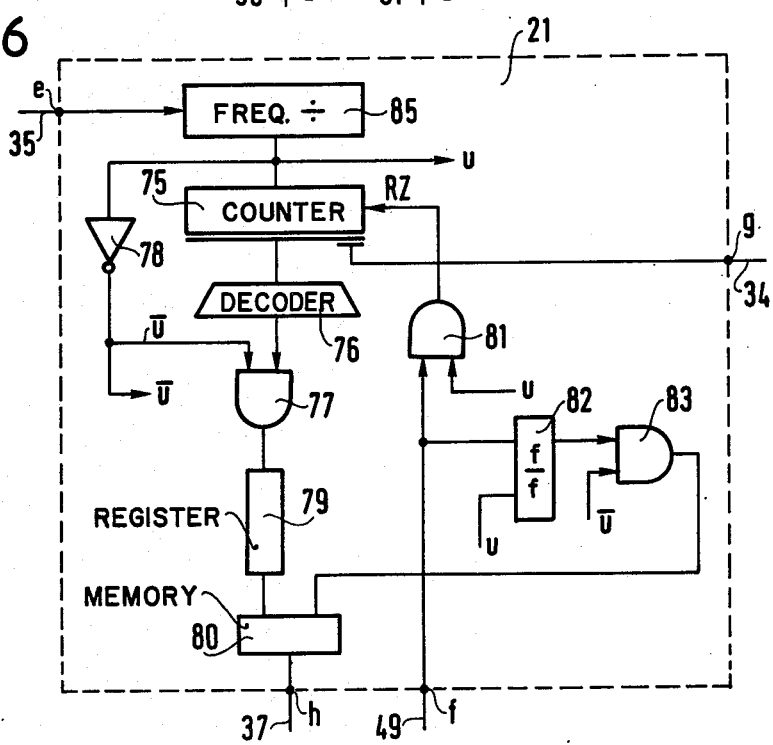
FIG. 6 shows a divider for an internal frequency.

FIG. 6 is a block diagram of the internal-frequency divider 21 of FIG. 2. The input terminal e receives a signal at the frequency of 6.144 MHz via the wire 35; this frequency is that of the oscillator 19, FIG. 2; a frequency divider 85 which divides by 3 has its input connected to said input terminal e and its output connected to the input of the binary counter 75 which is identical to the one in FIG. 5. The frequency divider delivers a signal u; the other components of FIG. 6 are identical to those in FIG. 5 and bear the same references. The difference between FIGS. 5 and 6 therefore resides in the presence of the frequency divider 85. The output terminal g is connected to the wire 34 and corresponds to the output terminal c of FIG. 5; the output terminal h is connected to the wire 37 and corresponds to the output terminal d of FIG. 5; the output terminal f is connected to the wire 49 and corresponds to the input terminal b of FIG. 5. The signal u at the output of the frequency divider 85 is at the same frequency as the external reference signal W of FIG. 5.

The various logic gates and inverters are advantageously integrated circuits, as are the frequency dividers; for example, series 74 Texas Instruments integrated circuits, which are well known to the man in the art, will be used for this purpose. One of the applications of the invention is the selection unit of a time-division telecommunications exchange in which the various components which constitute it must be driven by a single time base; the clock signals drive the components of the selection unit and the various signals used in the selection unit are obtained by division of the clock signal 2h.

What is claimed is:

1. A time base for generating clock pulses and frame synchronizing pulses, said time base comprising three identical generators each of which includes a base oscillator for generating a basic signal proper to the generator and a phase comparator means for applying the basic signals of all three base oscillators to a phase comparator in each generator, said phase comparators being arranged to apply a frequency control signal to their respective oscillators to generate their basic signals in synchronism with each other, each of the generators further including a clock signal generating circuit comprising a majority circuit connected to receive all three basic signals and driving a filter circuit tuned to the clock pulse frequency, the output of the filter circuit being delivered via an amplifier to provide the clock pulses with a pulse waveform and the clock signal generating circuit including a differential amplifier responsive to the marks and the spaces of the clock pulse waveform to bias the output of the filter to achieve a desired mark/space ratio, each of the generators also including means for generating and synchronizing the frame synchronizing pulses, said generating and synchronizing means comprising an internal-frequency divider connected to receive the clock pulses and to produce the frame synchronizing pulses therefrom, a first frame synchronizing majority circuit connected to receive frame synchronizing pulses from all three generators to derive a reset signal for the internal-frequency divider, and a feed-back circuit for modifying the frequency control of the base oscillator in response to the synchronization of the frame synchronizing signals.

2. A time base according to claim 1, wherein each of the generators further includes external reference means for generating frame-rate synchronizing pulses from an external reference signal, said external reference means comprising an external-frequency divider connected to receive the external reference signal and to produce externally-based frame-rate synchronizing pulses therefrom, and a second frame synchronising majority circuit connected to receive externally-based frame-rate synchronising pulses from all three generators to derive a reset signal for the external-frequency divider, the feed-back circuit of the internally-based frame synchronizing pulse generator being connected to the external reference means to enable modifications to be made to the frequency control of the base oscillator in response thereto.

3. A time base according to claim 1, wherein the phase comparator includes a delay device, two transistors and at the input first and second NAND gates and a first inverter, said first NAND gate being connected by a first input via an inverter to the basic signal of one generator, by a second input via an inverter to the basic signal of another generator, by a third input to the third basic signal, said second NAND gate being connected by a first input to the basic signal of a generator, by a second input to the basic signal of another generator, by a third input to the output of the first inverter whose input receives the third basic signal, the output of the first inverter being connected by a second inverter, which as one input, of the delay device one of whose outputs is connected by a third inverter to a fourth input of the two NAND gates, the first NAND gate being connected at the output to the base of a first NPN type transistor by a fourth inverter in series with a resistor, the emitter of the first transistor being connected firstly to earth and secondly to its base by a capacitor, the collector of the first transistor being connected by a resistor to the control input of the oscillator which is itself connected to earth by a capacitor, the second NAND gate being connected at its output to the base of a second NPN type transistor in series with a first resistor and a second resistor, the emitter of the second transistor being connected to a stabilized DC voltage to the base by a capacitor and to a point common to the first and second resistors by a third resistor, the collector of the second transistor being connected to the control input of the oscillator by a fourth resistor.

4. A time base according to claim 1, wherein the feed-back circuit is constituted by five resistors, a capacitor and an exclusive OR gate one of whose inputs is connected to the external-frequency divider and another of whose inputs is connected to the internal-frequency divider, said exclusive OR gate being connected at its output firstly to a stabilized DC voltage by a first one of the resistors and secondly via a fourth one of the resistors to a point common to a divider bridge constituted by a second one of the resistors and by a third one of the resistors, said divider bridge being connected between the stabilized voltage and earth, said point common to the fourth resistor to the divider bridge being connected to earth by said capacitor and secondly to the control input of the base oscillator, said control input itself being connected to earth by a capacitor.

5. A time base according to claim 1, wherein each generator includes a protective device for each input of the basic signals delivered by the other two generators, a first basic signal being applied to a first inverter, to a first resistor connected to a DC voltage, and via a first capacitor, to a second resistor connected to the DC voltage, to the emitter of a PNP type transistor via a first diode and to a first input of a first NAND gate of the phase comparator, said first inverter being connected at its output to the DC voltage firstly via a third resistor and secondly via a second capacitor and a fourth resistor, and also via the second capacitor to the emitter of said transistor via a second diode and to a first input of a second NAND gate of the phase camparator, a second basic signal being applied to a second inverter, to a fifth resistor connected to the DC voltage, and via a third capacitor to a sixth resistor connected to the DC voltage, to the emitter of the transistor via a third diode, and to a second input of the first NAND gate, said second inverter being connected at its output to the DC voltage firstly by a seventh resistor and secondly via a fourth capacitor and an eighth resistor, and also via the second capacitor to the emitter of the transistor via a fourth diode and to a second input of the second NAND gate, said transistor having its emitter connected by a ninth resistor to the DC voltage, its base connected firstly to the DC voltage via a resistor and secondly to the earth by a tenth resistor and its collector connected to earth.

6. A time base according to claim 1, wherein the clock signal generating circuit includes a first NAND gate which receives at its input a first basic signal and a second basic signal, a second NAND gate which receives at its inputs the second and third basic signals, a third NAND gate which receives at its inputs the third basic signal, each NAND gate being connected at its output to a respective input of a fourth NAND gate whose output is connected via a first resistor to a mid point of a first winding of a transformer, said first winding having its ends connected by a first capacitor and one end connected to a DC voltage, a second winding of said transformer having one end connected firstly to the eath by a second resistor and secondly to the collector of a first NPN type transistor and another end connected to a first inverter which delivers at the output an inverted clock signal, the output of said first inverter being connected firstly to a second inverter whose output is connected to an input of an internal-frequency divider and secondly to a third inverter, said third inverter having its output connected firstly to a first inverter and secondly to the DC voltage by a third resistor and to the base of the first NPN type transistor by a fourth resistor, said first transistor having its base connected to earth by a second capacitor and its emitter connected to the DC voltage by a fifth resistor, said first transistor having its emitter connected to the emitter of a second transistor which has its collector connected to the emitter of a second transistor which has its collector connected to earth and its base connected firstly to earth by a third capacitor and secondly to the output of the fourth inverter by a sixth resistor the output of said fourth inverter being connected to the DC voltage by a seventh resistor.

* * * * *